United States Patent
Chung et al.

(10) Patent No.: US 9,123,443 B2
(45) Date of Patent: Sep. 1, 2015

(54) MEMORY DEVICE, MEMORY MANAGEMENT DEVICE, AND MEMORY MANAGEMENT METHOD

(75) Inventors: Hyun-Mo Chung, Seongnam-si (KR); Yong-Suk Lee, Seongnam-si (KR)

(73) Assignee: OCZ Storage Solutions, Inc., San Jose, CA (US)

( * ) Notice: Subject to any disclaimer, the term of this patent is extended or adjusted under 35 U.S.C. 154(b) by 0 days.

(21) Appl. No.: 13/147,403

(22) PCT Filed: Dec. 2, 2009

(86) PCT No.: PCT/KR2009/007124
§ 371 (c)(1),
(2), (4) Date: Aug. 2, 2011

(87) PCT Pub. No.: WO2010/090390
PCT Pub. Date: Aug. 12, 2010

(65) Prior Publication Data
US 2012/0030435 A1  Feb. 2, 2012

(30) Foreign Application Priority Data
Feb. 5, 2009  (KR) .................. 10-2009-0009229

(51) Int. Cl.
| | | |
|---|---|---|
| G06F 12/00 | (2006.01) | |
| G11C 29/08 | (2006.01) | |
| G01R 31/28 | (2006.01) | |
| G06F 17/50 | (2006.01) | |
| G11C 16/34 | (2006.01) | |
| G11C 29/12 | (2006.01) | |
| G11C 16/04 | (2006.01) | |

(52) U.S. Cl.
CPC ............. *G11C 29/08* (2013.01); *G01R 31/28* (2013.01); *G06F 17/5022* (2013.01); *G11C 16/349* (2013.01); *G11C 29/12* (2013.01); *G11C 16/04* (2013.01)

(58) Field of Classification Search
CPC ...................... G06F 17/5022; G01R 31/28
See application file for complete search history.

(56) References Cited

U.S. PATENT DOCUMENTS

| | | | | |
|---|---|---|---|---|
| 5,661,729 | A * | 8/1997 | Miyazaki et al. | 365/201 |
| 6,876,591 | B2 * | 4/2005 | Gappisch et al. | 365/201 |
| 7,941,722 | B2 * | 5/2011 | Cussonneau et al. | 714/742 |
| 2003/0154426 | A1 * | 8/2003 | Chow et al. | 714/30 |

FOREIGN PATENT DOCUMENTS

| | | |
|---|---|---|
| JP | 10-320984 | 12/1998 |
| JP | 2002-170397 | 6/2002 |
| JP | 2002-367399 | 12/2002 |
| JP | 2007-010606 | 1/2007 |
| JP | 2007-188620 | 7/2007 |
| JP | 2007-201786 | 8/2007 |
| JP | 2007-272982 | 10/2007 |

* cited by examiner

*Primary Examiner* — Charles Rones
*Assistant Examiner* — Tian-Pong Chang
(74) *Attorney, Agent, or Firm* — Hartman Global IP Law; Gary M. Hartman; Michael D. Winter

(57) ABSTRACT

Disclosed is a memory device which receives a check command and check information from a Central Processing Unit (CPU), reads data written in a predetermined area of a memory based on the check information in response to the check command, and checks a data pattern of the data read based on the check information.

16 Claims, 3 Drawing Sheets

MEMORY DEVICE, MEMORY MANAGEMENT DEVICE, AND MEMORY MANAGEMENT METHOD

CROSS-REFERENCE TO RELATED APPLICATIONS

This application is the National Stage of International Application No. PCT/KR2009/007124, filed on Dec. 2, 2009, which claims the priority of Korean Patent Application No. 10-2009-0009229, filed on Feb. 5, 2009. The contents of all applications are hereby incorporated by reference in their entirety.

TECHNICAL FIELD

The present invention relates to a memory device, a memory management device, and a memory management method, and more particularly, to a memory device, a memory management device, and a memory management method, capable of checking a pattern of data written in a memory, without deterioration of system performance.

BACKGROUND ART

A storage device for storing data may include, for example, a magnetic disk, a semiconductor memory, and the like. Since physical characteristics are different for each type of storage device, a management method corresponding to the distinctive physical characteristics is required.

Conventionally, magnetic disks are widely used as storage devices. A read/write time of the magnetic disk takes an average of several milliseconds per kilobyte. Additionally, since an arrival time of an arm of the magnetic disk is different depending on a physical location where data is stored, the read/write time of the magnetic disk varies.

Recently, a non-volatile memory that takes a relatively short read/write time, consumes a small amount of power, and occupies a small amount of space, compared with a magnetic disk, is rapidly replacing the magnetic disk. This is because a capacity of the non-volatile memory is increasing.

The non-volatile memory may perform electronic reading, writing, and erasing. The non-volatile memory is a semiconductor memory device that is able to maintain stored data even when power is interrupted. A process of storing data in a non-volatile memory device is additionally referred to as programming, as well as writing.

A typical example of the non-volatile memory includes a flash memory. The flash memory has advantages of a small size, a low power consumption, and a high read rate, when compared with a conventional Hard Disk Drive (HDD). Recently, a Solid State Disk (SSD) using a high-capacity flash memory was proposed to replace an HDD.

The flash memory may typically include, for example, a NAND-type flash memory, a NOR-type flash memory, and the like. A NAND scheme and a NOR scheme may be distinguished based on a configuration and an operating scheme of a cell array.

A flash memory includes an array of a plurality of memory cells, and a single memory cell may store at least one data bit. A single memory cell includes a control gate and a floating gate, and an insulator is inserted between the control gate and the floating gate. An insulator is also inserted between the floating gate and a substrate.

The non-volatile memory is managed by a predetermined controller. Additionally, an overall performance of the non-volatile memory may be determined based on a performance of the controller.

Accordingly, there is a desire for research on a method that may efficiently manage and control a memory.

DISCLOSURE OF INVENTION

Technical Goals

An aspect of the present invention provides a memory device, a memory management device, and a memory management method, which may be capable of checking a pattern of data written in a predetermined area of a memory without a Central Processing Unit (CPU) accessing a Random Access Memory (RAM), thereby preventing deterioration of system performance that may occur while checking the data pattern.

Technical solutions

According to an aspect of the present invention, there is provided a memory device, including a reception unit to receive a check command and check information from a Central Processing Unit (CPU), a read unit to read data written in a predetermined area of a memory based on the check information in response to the check command, and a check unit to check a data pattern of the data read based on the check information.

According to an aspect of the present invention, there is also provided a memory management device, including a control register in which a check command and check information may be written by a Central Processing Unit (CPU), a read unit to read data written in a predetermined area of a memory based on the check information, in response to the check command when the check command and the check information are written in the control register, a check unit to check a data pattern of the data read based on the check information, and a status register in which a result of the check performed by the check unit is written.

According to an aspect of the present invention, there is also provided a memory management method, the method including receiving a check command and check information from a Central Processing Unit (CPU), reading data written in a predetermined area of a memory based on the check information in response to the check command, and checking a data pattern of the data read based on the check information.

Effect of Invention

According to an embodiment of the present invention, provided are a memory device, a memory management device, and a memory management method, which may be capable of checking a pattern of data written in a predetermined area of a memory without a Central Processing Unit (CPU) accessing a Random Access Memory (RAM), and thus it is possible to prevent deterioration in system performance that may occur while checking the data pattern.

BEST MODE FOR CARRYING OUT THE INVENTION

Figure 1:
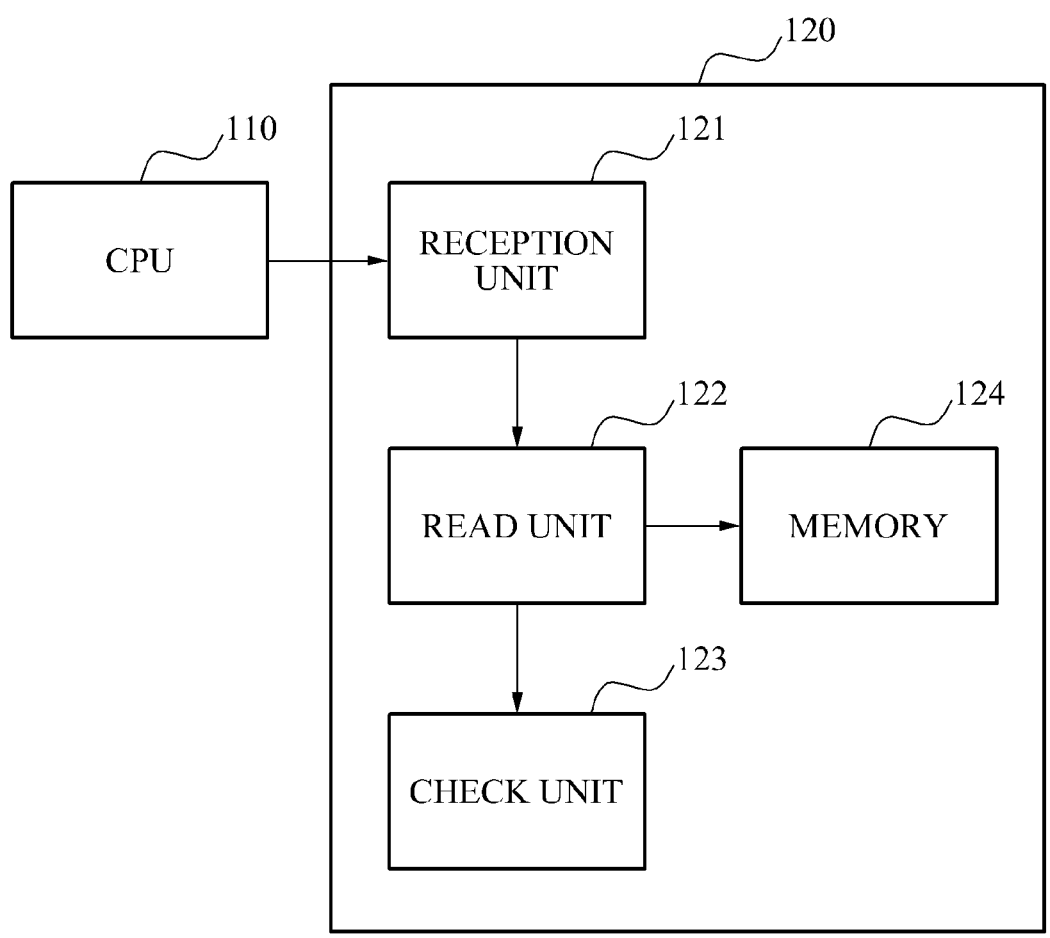
FIG. 1 is a block diagram illustrating a configuration of a memory device according to an embodiment of the present invention.

Reference will now be made in detail to embodiments of the present invention, examples of which are illustrated in the accompanying drawings, wherein like reference numerals refer to the like elements throughout. The embodiments are described below in order to explain the present invention by referring to the figures.

Generally, programming of a non-volatile memory may be performed by in page units and erasing may be performed in block units. Here, a block may include a plurality of pages.

Also, a memory controller for managing the non-volatile memory may provide a logical address to an external host or a processor, and may provide a physical address of the non-volatile memory.

In this instance, the memory controller may manage the non-volatile memory using the physical address, and may convert the physical address into the logical address.

Here, a layer in which converting of the physical address and the logical address is performed is referred to as a Flash Translation Layer (FTL).

A typical example of the non-volatile memory includes a flash memory. The flash memory may typically include, for example, a NAND-type flash memory, a NOR-type flash memory, and the like.

The NAND-type flash memory is widely used as the non-volatile memory due to a higher integration and a higher ratio of cost to capacity in comparison to the NOR-type flash memory, however, random access is impossible in the NAND-type flash memory which is dissimilar to the NOR-type flash memory.

In order to check a pattern of data written in a predetermined area of the NAND-type flash memory, a method of reading contents of the predetermined area into a Random Access Memory (RAM), and checking the contents copied into the RAM may be used.

In this instance, a process of reading data from a memory into the RAM, and a process of accessing the RAM by the Central Processing Unit (CPU) in order to check contents of the data are performed, and accordingly two memory bus accesses are necessary, which may result in deterioration of system performance.

According to an embodiment of the present invention, a memory device, and a memory management device may receive a predetermined data pattern from the CPU, and may check a pattern of data written in a predetermined area of a memory by comparing the pattern of data written in the predetermined area of the memory, and the predetermined data pattern, thereby preventing deterioration of system performance due to the CPU and the memory bus being occupied.

The memory device and the memory management device according to an embodiment of the present invention will be further described hereinafter with reference to FIGS. 1 and 2.

FIG. 1 is a block diagram illustrating a configuration of a memory device 120 according to an embodiment of the present invention.

Referring to FIG. 1, a Central Processing Unit (CPU) 110 and the memory device 120 are illustrated.

The memory device 120 may include a reception unit 121, a read unit 122, and a check unit 123.

A memory 124 may correspond to a NAND-type flash memory.

The reception unit 121 may receive a check command and check information from the CPU 110.

The read unit 122 may read data written in a predetermined area of the memory 124 based on the check information in response to the received check command.

Here, the check information may include memory area information.

The memory area information may include start address information and size information of the predetermined area of the memory 124.

In this instance, the read unit 122 may read the data written in the predetermined area of the memory 124 based on the memory area information.

That is, when the reception unit 121 receives, from the CPU 110, the start address information and the size information of the predetermined area of the memory 124, the read unit 122 may read the data from the predetermined area of the memory 124 based on the start address information and the size information.

The check unit 123 may check a data pattern of the data read by the read unit 122 based on the check information.

Here, the check information may include information about a predetermined data pattern.

In this instance, the check unit 123 may determine whether the predetermined data pattern and the data pattern of the read data are consistent with each other, by comparing the predetermined data pattern and the data pattern of the read data.

When the predetermined data pattern and the data pattern of the read data are inconsistent with each other, the check unit 123 may generate an error message.

For example, when the CPU 110 checks whether the data written in the predetermined area of the memory 124 is consistent with a value of "1234567b," the CPU 110 may transmit information about the data pattern of "1234567b" to the memory device 120.

That is, the check unit 123 may determine whether the data pattern of the data read by the read unit 122, and the data pattern of "1234567b" are consistent with each other, and may generate an error message when the two data patterns are inconsistent with each other.

When the check unit 123 terminates the check of the data pattern, the memory device 120 may discard the read data, instead of storing the read data in a RAM.

According to an embodiment of the present invention, when the CPU 110 checks the pattern of the data written in the memory 124, the memory device 120 may enable the check of the data pattern using the reception unit 121, the read unit 122, and the check unit 123 included in the memory device 120, thereby preventing overall deterioration of system performance, unlike a conventional method in which a data pattern is checked using a RAM.

The memory device 120 according to an embodiment of the present invention has been described with reference to FIG. 1.

According to an embodiment of the present invention, a basic idea of the present invention for performing checking of a data pattern may be embodied by incorporating a configuration to perform a predetermined function in an internal part of the memory device 120 as illustrated in FIG. 1, or may be embodied to be a predetermined memory management device that may exist independently of the memory device 120, and may be connected to the memory device 120.

The memory management device according to an embodiment of the present invention will be further described hereinafter with reference to FIG. 2.

Figure 2:
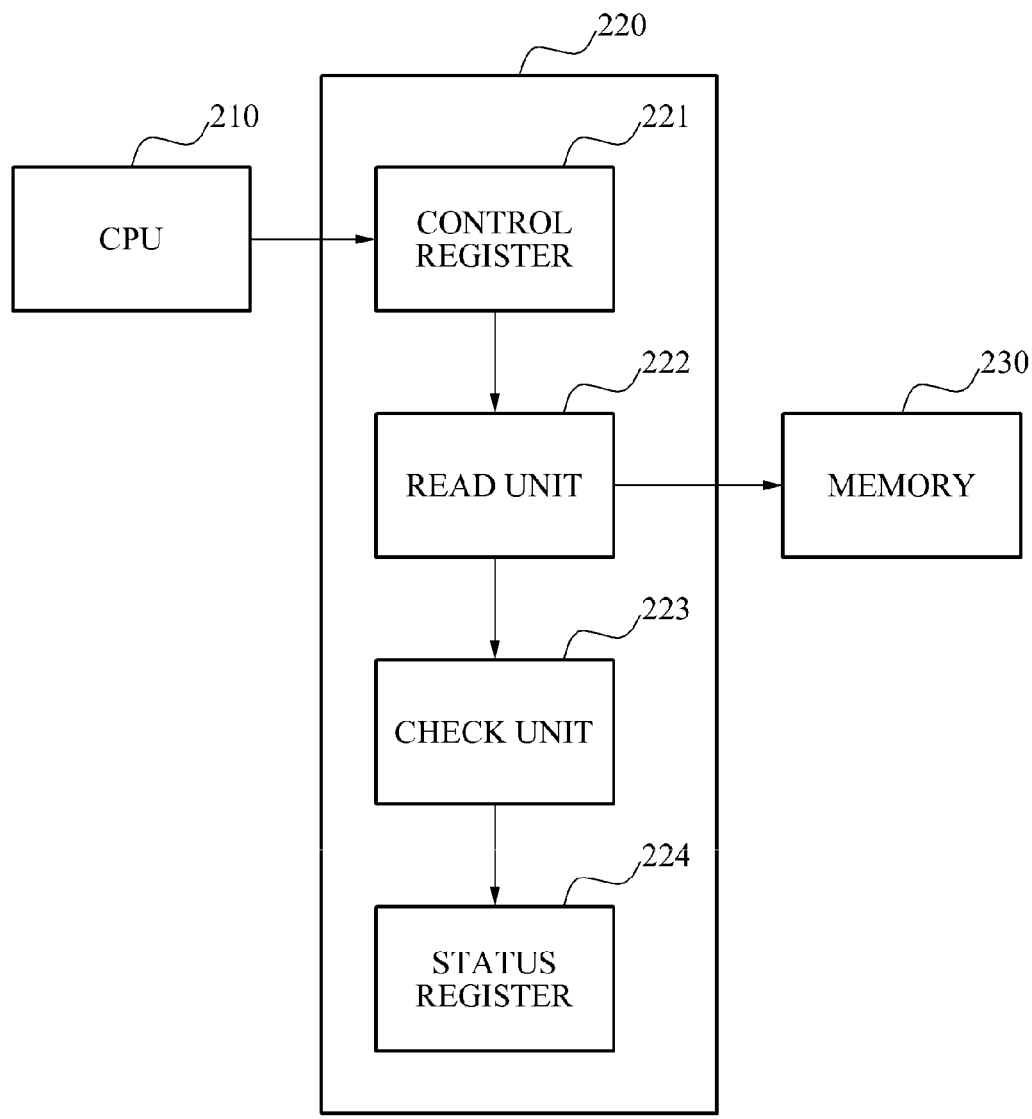
FIG. 2 is a block diagram illustrating a configuration of a memory management device according to another embodiment of the present invention.

FIG. 2 is a block diagram illustrating a configuration of a memory management device 220 according to another embodiment of the present invention.

Referring to FIG. 2, a CPU 210, the memory management device 220, and a memory 230 are illustrated.

The memory management device 220 may include a control register 221, a read unit 222, a check unit 223, and a status register 224.

The memory 230 may correspond to a NAND-type flash memory.

In the control register 221, a check command and check information may be written by the CPU 210.

When the check command and the check information are written in the control register 221, the read unit 222 may read data written in a predetermined area of the memory 230 based on the check information in response to the check command.

The check information may include memory area information.

The memory area information may include start address information and size information of the predetermined area of the memory 230.

In this instance, the read unit 222 may read the data written in the predetermined area of the memory 230 based on the memory area information.

That is, when the CPU 210 writes the start address information, the size information, and the like in the predetermined area of the memory 230, the read unit 222 may read the data from the predetermined area of the memory 230 based on the start address information and the size information.

The check unit 223 may check a data pattern of the data read by the read unit 222 based on the check information.

In the status register 224, a result of the check of the check unit 223 may be written.

Here, the check information may include information about a predetermined data pattern.

In this instance, the check unit 223 may determine whether the predetermined data pattern and the data pattern of the read data are consistent with each other, by comparing the predetermined data pattern and the data pattern of the read data.

When the predetermined data pattern and the data pattern of the read data are inconsistent with each other, the check unit 223 may generate an error message, and may write the generated error message in the status register 224.

For example, when the CPU 210 checks whether the data written in the predetermined area of the memory 230 is consistent with a value of "1234567b," the CPU 210 may transmit information about the data pattern of "1234567b" to the control register 221.

That is, the check unit 223 may determine whether the data pattern of the data read by the read unit 222, and the data pattern of "1234567b" are consistent with each other, and may generate an error message when the two data patterns are inconsistent with each other.

The check unit 223 may indicate that the MISMATCH error occurs, to the status register 224.

The CPU 210 may determine that the pattern of the data written in the predetermined area of the memory 230 is incorrect, through the status register 224.

When the check unit 223 terminates the check of the data pattern, the memory management device 220 may discard the read data, instead of storing the read data in a RAM.

According to an embodiment of the present invention, when the CPU 210 checks the pattern of the data written in the memory 230, the memory management device 220 may enable the check of the data pattern thereby preventing overall deterioration of system performance, unlike a conventional method in which a data pattern is checked using a RAM.

Figure 3:
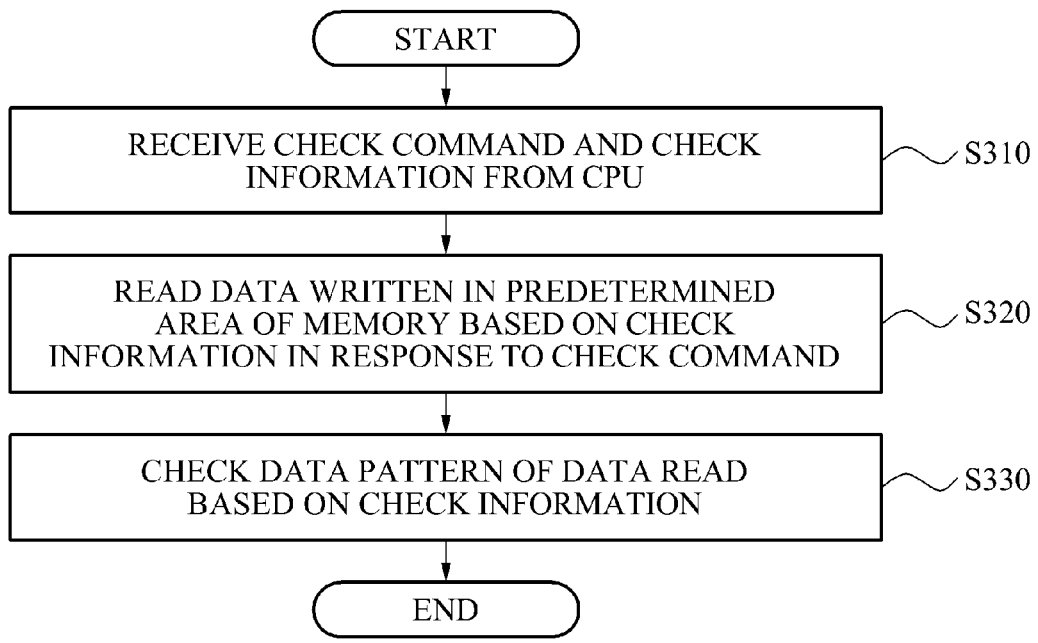
FIG. 3 is a flowchart illustrating a memory management method according to still another embodiment of the present invention.

FIG. 3 is a flowchart illustrating a memory management method according to still another embodiment of the present invention.

In operation S310, a check command and check information may be received from a CPU.

In operation S320, data written in a predetermined area of a memory may be read based on the check information in response to the check command.

The check information may include memory area information.

The memory area information may include start address information and size information of the predetermined area of the memory.

In this instance, in operation S320, the data written in the predetermined area of the memory may be read based on the memory area information.

In operation S330, a data pattern of the data read in operation S320 based on the check information may be checked.

Here, the check information may include information about a predetermined data pattern.

In this instance, in operation S330, the predetermined data pattern and the data pattern of the read data may be compared. When the predetermined data pattern and the data pattern of the read data are inconsistent with each other, an error message may be generated.

The memory management method according to an embodiment of the present invention has been described with reference to FIG. 3. Here, the memory management method may correspond to the configurations of the memory device 120, and the memory management device 220 that have been described with reference to FIGS. 1 and 2, and accordingly a further description in relation to the memory management method will be omitted for conciseness.

The memory management method according to an embodiment of the present invention may be recorded in computer-readable media including program instructions to implement various operations embodied by a computer. The media may also include, alone or in combination with the program instructions, data files, data structures, and the like. Examples of computer-readable media include magnetic media such as hard disks, floppy disks, and magnetic tape; optical media such as CD ROM discs and DVDs; magneto-optical media such as optical discs; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations of the above-described exemplary embodiments of the present invention, or vice versa.

Although a few embodiments of the present invention have been shown and described, the present invention is not limited to the described embodiments. Instead, it would be appreciated by those skilled in the art that changes may be made to these embodiments without departing from the principles and spirit of the invention, the scope of which is defined by the claims and their equivalents.

The invention claimed is:

1. A memory device comprising:
    a memory array having a data pattern written in a predetermined area of the memory array, the predetermined area having a start address and a size;
    a reception unit to receive a check command and check information from a Central Processing Unit (CPU), the check information comprising memory area information, the memory area information comprising the start address and size of to the predetermined area and the data pattern previously written to the predetermined area of the memory array;

a read unit to read data written in the predetermined area of the memory array based on the start address and size of the predetermined area included in the check information and in response to the reception unit receiving the check command; and a check unit to check the data read based on the check information by comparing the data pattern included in the check information and the data read by the read unit, wherein the memory device is configured to perform a check of the data written in the predetermined area of the memory array in response to the reception unit receiving the check command.

2. The memory device of claim 1, wherein the data pattern was written in the predetermined area of the memory array in response to a data write command being sent from the CPU.

3. The memory device of claim 1, wherein the check unit generates an error message when the data pattern and the data read are inconsistent with each other.

4. The memory device of claim 1, wherein the memory array is a flash memory.

5. A memory management device comprising:

a control register in which a check command and check information are written by a Central Processing Unit (CPU), the check information comprising a data pattern that was written to a predetermined area of a memory array prior to the check command and check information being written to the control register, the predetermined area having a start address and a size, the check information comprising the start address and the size of the predetermined area;

a read unit to read data written in the predetermined area of the memory array based on the start address and size of the predetermined area included in the check information and in response to the check command when the check command and the check information are written in the control register, wherein the memory array is on a memory device that is separate from the memory management device;

a check unit to check the data read based on the check information by comparing the data pattern included in the check information and the data read by the read unit; and a status register in which a result of the check performed by the check unit is written.

6. The memory management device of claim 5, wherein the check unit generates an error message, and writes the error message in the status register when the data pattern and the read data are inconsistent with each.

7. The memory management device of claim 5, wherein the memory array is a flash memory.

8. The memory management device of claim 5, wherein the data pattern was written in the predetermined area of the memory array as a result of a data write command being sent from the CPU.

9. A memory management method comprising:

writing a data pattern to a predetermined area of a memory array, the predetermined area having a start address and a size;

receiving a check command and check information from a Central Processing Unit (CPU), the check information comprising the start address and the size of the predetermined area and the data pattern;

reading data written in the predetermined area of a memory array based on the start address and size of the predetermined area included in the check information and in response to receiving the check command; and checking the data read based on the check information by comparing the data pattern included in the check information and the data read, wherein the checking of the data is performed without accessing the data with the CPU.

10. The method of claim 9, wherein the checking comprises generating an error message when the data pattern and the read data are inconsistent with each other.

11. The method of claim 9, wherein the memory array is a flash memory.

12. The method of claim 9, wherein the writing of the data pattern in the predetermined area of the memory array is performed as a result of a data write command being sent from the CPU.

13. A non-transitory computer readable recording medium storing a program to cause a computer to implement the method of claim 9.

14. A non-transitory computer readable recording medium storing a program to cause a computer to implement the method of claim 10.

15. A non-transitory computer readable recording medium storing a program to cause a computer to implement the method of claim 11.

16. A non-transitory computer readable recording medium storing a program to cause a computer to implement the method of claim 12.

* * * * *